United States Patent [19]

Baldwin et al.

[11] 4,396,991
[45] Aug. 2, 1983

[54] LONG TERM RESPONSE ENHANCEMENT FOR DIGITAL PHASE-LOCKED LOOP

[75] Inventors: David R. Baldwin; Nicholas S. Lemak, both of Phoenix, Ariz.

[73] Assignee: Honeywell Information Systems Inc., Phoenix, Ariz.

[21] Appl. No.: 251,805

[22] Filed: Apr. 7, 1981

[51] Int. Cl.³ .................. G06F 15/20; H03B 3/04
[52] U.S. Cl. .................... 364/736; 328/55; 328/155; 364/484
[58] Field of Search .......... 364/484, 701, 703, 715, 364/724, 736; 328/55, 155

[56] References Cited

U.S. PATENT DOCUMENTS

| | | | |
|---|---|---|---|
| 3,878,473 | 4/1975 | Furtney, Jr. | 328/155 X |
| 3,889,186 | 6/1975 | Larson | 328/155 X |
| 3,983,498 | 9/1976 | Malek | 328/155 |
| 4,131,856 | 12/1978 | Chapman | 328/155 |

*Primary Examiner*—Jerry Smith
*Attorney, Agent, or Firm*—Arthur A. Sapelli; Wm. W. Holloway, Jr.; L. J. Marhoefer

[57] ABSTRACT

A long term response enhancement for a digital phase-locked loop is implemented to provide a relatively minor change in the phase of the output signal over a relatively long period of time. The basic digital phase-locked loop determines the average number of pulses from a clock source which occur or are expected to occur between successive occurrences of the input signal to the digital phase-locked loop, and compares the number of pulses counted from the occurrence of the last output signal with the average number of pulses expected to occur between successive input signals, producing an output signal when the two numbers agree. The present invention modifies the average count prior to comparison with the number of pulses counted from the occurrence of the last output signal, by adding a one or a zero to the average count, based upon comparison of the previous two averages present during the previous two cycles of the input signal with the current average, with either a one or a zero added to the comparison number, thereby providing for slight modification of the time at which the output signal would be produced.

4 Claims, 16 Drawing Figures

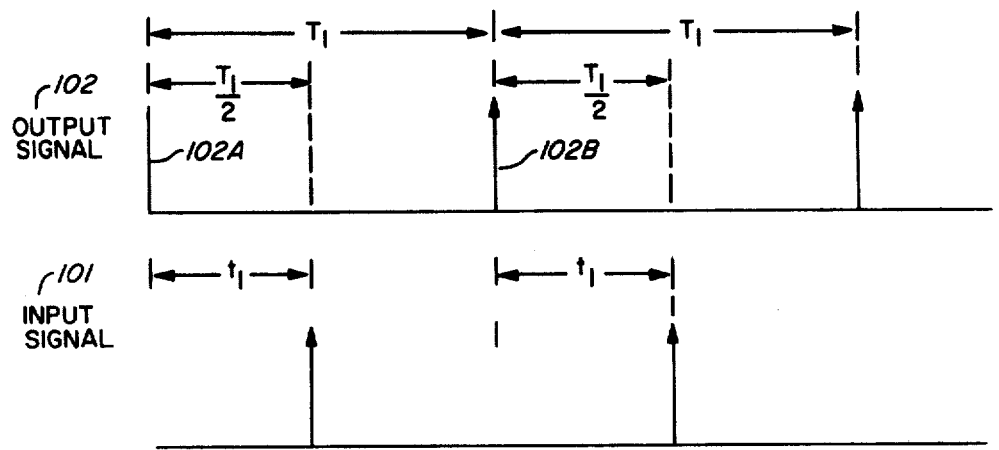
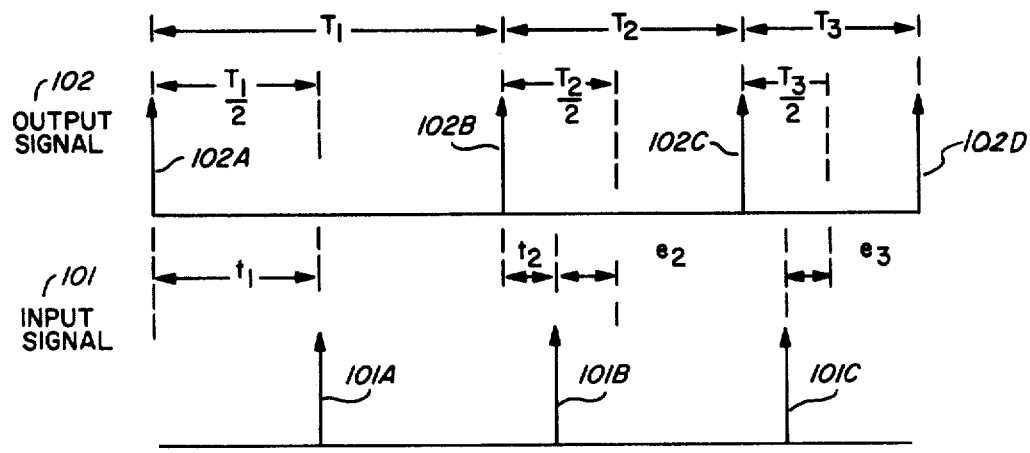
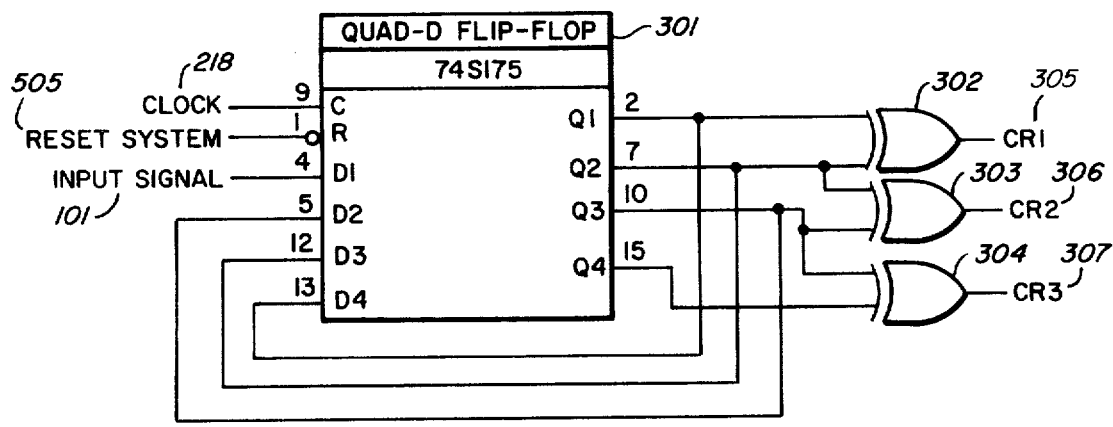

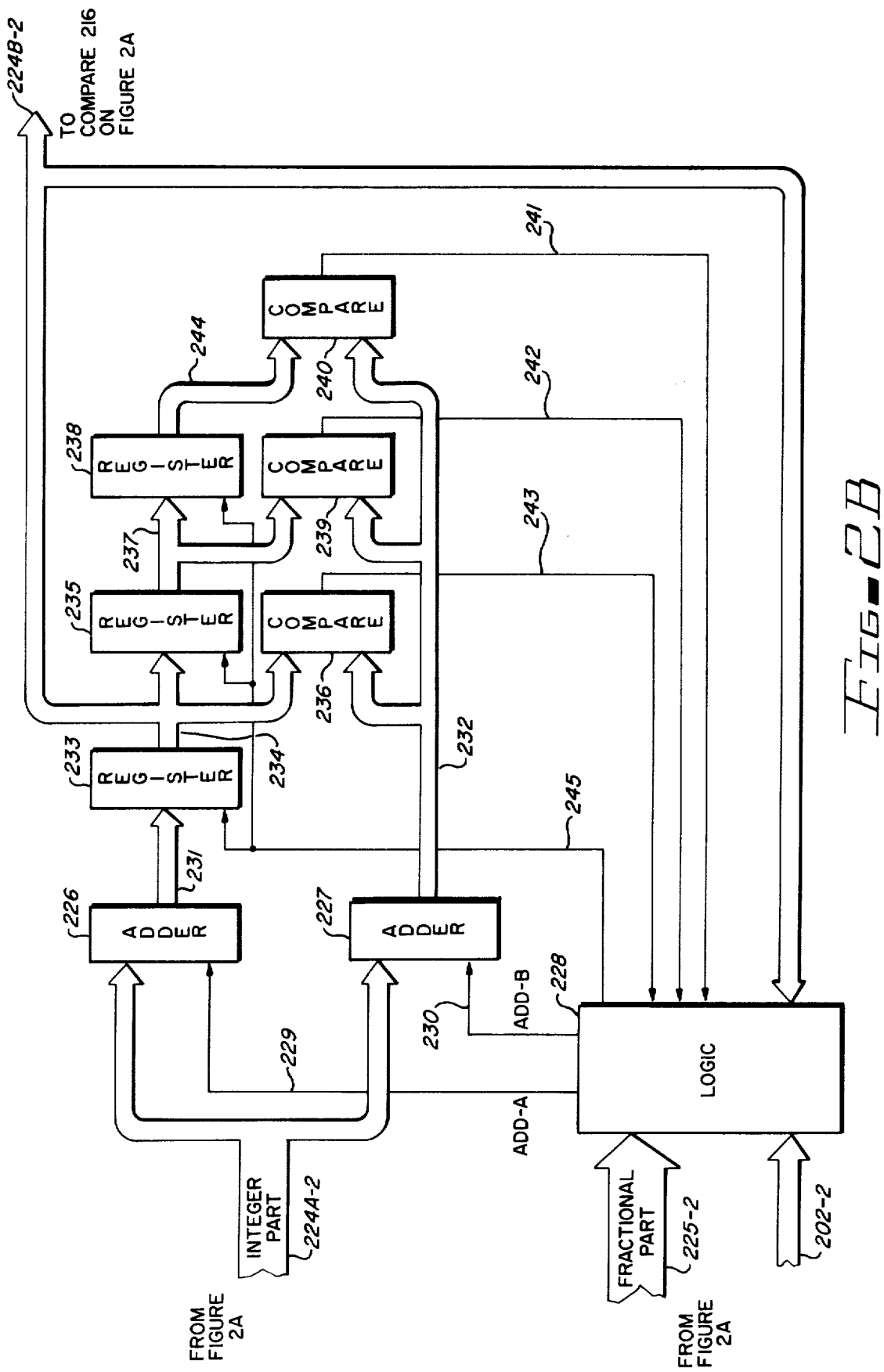

COMPARE 216

TIMING SIGNALS

ADDER 208 AND ERROR WEIGHTING 204

SUBTRACTOR 246 AND HOLDING REGISTER 221

LONG TERM RESPONSE ENHANCEMENT FOR DIGITAL PHASE-LOCKED LOOP

CROSS REFERENCE TO RELATED APPLICATIONS

Application Ser. No. 251,845, filed Apr. 7, 1981, entitled DIGITAL PHASE-LOCKED LOOP by David R. Baldwin and Nicholas S. Lemak, and Application Ser. No. 251,846, filed July 10, 1981, entitled SHORT TERM RESPONSE ENHANCEMENT FOR DIGITAL PHASE-LOCKED LOOP by David R. Baldwin and Nicholas S. Lemak.

BACKGROUND OF INVENTION

1. Field of Invention

This invention relates to electronic circuits using phase-locked loops, and more particularly to a long term response enhancement for a digital phase-locked loop.

2. Description of Prior Art

A phase-locked loop is a device which produces an output signal at a frequency identical to and in phase with a signal supplied as an input thereto. As the input signal change in frequency, the output signal will likewise change in frequency in such a manner to maintain a zero difference in phase between the input and output signals.

In the past, phase-locked loops have been implemented using analog techniques. A basic analog phase-locked loop consists of three fundamental parts: a Phase Detector, a Filter, and a Voltage-Controlled Oscillator.

The Phase Detector is a device which detects the difference in phase between two input signals, and produces an output signal proportional to the amount of said phase difference. In a phase-locked loop, the two inputs to the Phase Detector are the Input Signal to the phase-locked loop, and the Output Signal of the phase-locked loop from a Voltage-Controlled Oscillator. The Output Signal from the Phase Detector is an analog signal, the magnitude of which is representative of the amount of phase difference between the two input signals thereto, hereinafter referred to as an error signal.

A Filter serves to remove any high-frequency components from the error signal produced by the Phase Detector, and provides a slowly varying Output Signal which is representative of the average error in phase between the Output Signal and the Input Signal.

A Voltage-Controlled Oscillator is an oscillator whose frequency is controlled by an Input Voltage. In a phase-locked loop, the Input Voltage to the Voltage-Controlled Oscillator is the output of the Filter, and is an error signal representative of the difference in phase between the Input Signal and the Output Signal. Due to the feedback of the Output Signal to one input of the Phase Detector, the frequency of the Voltage-Controlled Oscillator is adjusted by Input Voltage to produce agreement in phase between the Input Signal and the Output Signal.

While prior art implementations of phase-locked loops have employed varying amounts of digital techniques, analog techniques have always been present, to some extent; most notably in the filter section of the phase-locked loop.

The present digital phase-locked loop is distinguished from such prior art in that the implementation is accomplished using entirely digital techniques, as is the implementation of the present invention, a long term response enhancement for a digital phase-locked loop.

SUMMARY OF INVENTION

The response of the output of an analog phase-locked loop to a change in the phase of an input signal thereto is observed to be somewhat exponential in nature; similar to the voltage waveform appearing across a capacitor charging from a first voltage to a second voltage. In general terms, the response of a phase-locked loop to a change in phase on the input signal can be considered to be composed of two parts: a short term response which is responsible for a relatively major change in the phase of the output signal over a relatively short period of time; and a long term response, which is responsible for a relatively minor change in phase of the output signal over a relatively long period of time.

The present invention is directed to modifying the response of a digital phase-locked loop by incorporating a long term response component in the output characteristics of a phase-locked loop. In particular, the long term response term will produce a relatively minor change in the phase of the output signal over a relatively long period of time in response to a change in the phase of the input signal.

A primary object of the present invention is to provide for a response from a digital phase-locked loop similar to the response observed from an analog phase-locked loop.

A further object of the present invention is to modify the response from a digital phase-locked loop such that a change in the phase on the input signal will result in a relatively minor change in the phase of the output signal over a relatively long period of time.

A still further object of the present invention is to provide for a long term response enhancement for a digital phase-locked loop using strictly digital techniques.

The various novel features of this invention, along with the foregoing and other objects, as well as the invention itself both as to its organization and method of operation, may be more fully understood from the following description of a disclosed embodiment when read in conjunction with the accompanying drawings.

DESCRIPTION OF DRAWINGS

FIGS. 1A and 1B are a timing diagram illustrating the time relationships between the Input and Output signals for a digital phase-locked loop.

FIG. 1A illustrates the timing relationship between the input and output signals of a digital phase-locked loop for the case when there is zero phase difference between the input and output signals.

FIG. 1B illustrates the timing relationship between the input and output signals of a digital phase-locked loop when the input signal undergoes a change in phase.

FIGS. 2A and 2B taken together are a block diagram of a digital phase-locked loop with a long term response enhancement.

FIG. 2A illustrates the basic block diagram of a digital phase-locked loop when Integer Part 224A-1 from Divide-by-Eight 223 is connected directly to 224B-1 to Compare 216, disregarding Fractional Part 225-1.

FIG. 2B is a block diagram of the long term response enhancement for a digital phase-locked loop.

FIG. 3 illustrates the implementation of System Clock 217, shown in FIG. 2A.

DETAILED DESCRIPTION OF PREFERRED EMBODIMENT

Figure 2A:
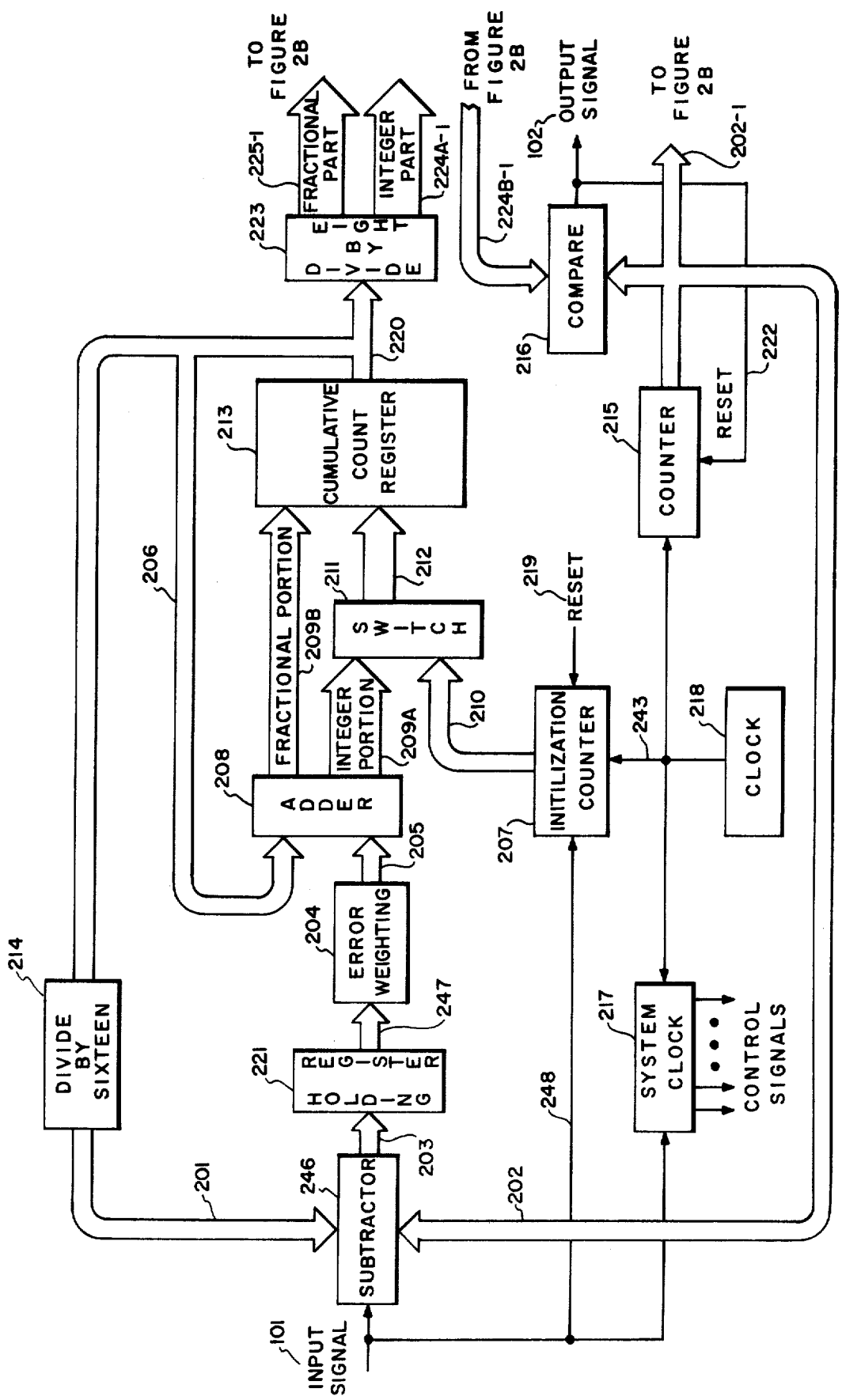

FIGS. 1A and 1B summarize the operation of a digital phase-locked loop in terms of the time relationships between the Output Signal 102 and Input Signal 101, as a result of a change in the phase of the Input Signal 101.

It should be understood in connection with FIGS. 1A and 1B that the events indicated on Input Signal 101 and Output Signal 102 are representative of the occurrence of a predefined event, such as a high-to-low transition, a low-to-high transition, the occurrence of an impulse signal, etc. The precise nature of the event is a matter of definition, and will depend upon the particular application of the present invention. Hereinafter, the occurrence of said event on the Input Signal 101 will be referred to as an Input Event, and the occurrence of an output on Output Signal 102 as an Output Event.

From FIG. 1A which illustrates the time relationship between the Input Event 101 and the Output Event 102 for the case when the Input Event 101 and Output Event 102 agree in frequency and in phase, it is observed that the Output Event will occur at a point midway between successive Input Events. In the digital phase-locked loop, this time relationship between Input and Output Events is defined to be indicative of a zero phase difference between the Input Signal 101 and the Output Signal 102. Consequently, the existence of a non-zero phase difference between the Input Event 101 and the Output Event 102 will be indicated by the occurrence of an Output Event at a point other than midway between successive Input Events.

FIG. 1B illustrates the effect on the Output Event 102 when the Input Event 101 undergoes a change in phase. It will be observed from FIG. 1B that the Input Event 101A occurs on Input Signal 101 at time interval t1 after the occurrence of Output Event 102A on Output Signal 102. For the case when the Input Event 101 and the Output Event 102 agree in both frequency and phase, t1=T1/2. Thereafter, Input Event 101 undergoes a change in phase with the occurrence of the next Input Event 101B on Input Signal 101. Input Event 101B occurs an amount of time t2 after the occurrence of Output Event 102B. Due to the change in phase of Input Event 101 by the occurrence of Input Event 101B earlier than expected, time period t2 will not equal one-half of the expected time between Output Events 102B and 102C had there been no change in the phase of the Input Event on Input Signal 101; in particular, there now exists an error e2 equal to one-half the difference in the expected time between the Output Events 102B and 102C, had there been no change in phase on Input Signal 101, and the time t2 between Output Event 102B and Input Event 101B, i.e., $e2=(T1/2)-t2$. It will be observed that as a result of Input Event 101B occurring earlier than expected, Output Event 102C, from the digital phase-locked loop, will now necessarily occur earlier following 102B than 102B occurred following 102A, i.e., T2 will be less than T1, as the phase-locked loop is now in the process of adjusting the frequency of the Output Event on Output Signal 102 to its new frequency of operation, in response to the change in the frequency of the Input Event on Input Signal 101, so that the phase of the Output Event will agree with the phase of the Input Event.

It is further observed during the next sequence of Input Event 101C and Output Event 102D, that Output Event 102D will again occur earlier than Output Event 102C, i.e., T3 will be less than T2, such that error e3 will be less than error e2. This sequence will continue until the amount of error, e, approaches zero, indicating agreement in both frequency and phase between the Input Signal 101 and Output Signal 102.

FIGS. 2A and 2B together are a detailed block diagram of an implementation of a digital phase-locked loop with a long term response enhancement. It is to be understood that each of the functional blocks represented in FIGS. 2A and 2B perform a function as herein described, and may or may not require hardware for their individual implementation.

The following description of an embodiment of the present invention will begin by first describing the operation of an implementation of a digital phase-locked loop, as illustrated in FIG. 2A with Integer Part 224A-1 from Divide-by-Eight 223 connected directly to 224B-1 to Compare 216, and disregarding Fractional Part 225-1. Thereafter, the implementation of the present invention, a long term response enhancement for a digital phase-locked loop will be discussed, wherein Fractional Part 225-1 and Integer Part 224A-1 from Divide-by-Eight 223 from FIG. 2A will connect to Fractional Part 225-2 and Integer Part 224A-2 on FIG. 2B, and 224B-2 on FIG. 2B to 224B-1 on FIG. 2A, with the signal 202-1 from Counter 215 shown on FIG. 2A connected to signal 202-2 to Logic 228 shown on FIG. 2B, thereby incorporating the present invention in a digital phase-locked loop.

The following discussion of the operation of a digital phase-locked loop will begin by a description of the functions performed by each of the functional blocks appearing in FIG. 2A, followed by a discussion of how the functional blocks operate together to perform the function of a digital phase-locked loop. Thereafter the implementation of each block will be given.

Next, a description of the function performed by each of the functional blocks appearing in the Long Term Response Enhancement for a Digital Phase-Locked Loop shown in FIG. 2B will be given, followed by a discussion of the implementation of each.

Referring to FIG. 2A, Subtractor 246 is a digital subtractor which, upon the occurrence of an Input Event on Input Signal 101, will perform the digital subtraction of a subtrahend 201, i.e., the contents of Cumulative Count Register 213 after division of the contents thereof by sixteen by Divide-by-Sixteen 214 from a minuend 202, i.e., the contents of Counter 215, to form a difference 203, hereinafter referred to as an error signal.

Holding Register 221 is a register which temporarily stores the results 203 of Subtractor 246.

Error Weighting 204 applies a numeric weighting factor to the digitally formatted error signal 247, producing a numeric result, in a digital format, as 205.

Adder 208 is a digital adder which performs the addition of the error signal 205 after appropriate weighting from Error Weighting 204 with the current contents 206 to Cumulative Count Register 213 to produce a sum composed of an Integer Portion 209A and a Fractional Portion 209B.

Initialization Counter 207 is a counter which is reset by a momentary low signal on Reset 219, and thereafter counts the number of pulses 243 generated by Clock 218 which occur during the time required for eight Input Events to occur on Input Signal 101.

Switch 211 is a digital switch which selects either the integer portion of the contents 209A of Adder 208 or the contents 210 of Initialization Counter 207 to be supplied by 212 to Cumulative Count Register 213.

Cumulative Count Register 213 is a register which contains a number which represents the number of pulses generated by Clock 218 which are expected to occur in the time required for eight Input Events to occur on Input Signal 101.

Divide-by-Sixteen 214 provides the functions of dividing the contents of Cumulative Count Register 213 by sixteen.

Divide-by-Eight 223 divides the current contents 220 of Cumulative Count Register 213 by eight, and produces the results of said division as an Integer Part 224A-1 and a Fractional Part 225-1.

Counter 215 is a counter which counts the number of pulses generated by Clock 218 in a given time period, and is reset by signal 222 on the occurrence of an Output Event on Output Signal 102.

Compare 216 is a digital comparator which compares the numeric contents of Counter 215 with the number present on 224B-1, and generates Output Signal 102 when the said two numeric values agree.

Clock 218 is a source of pulses regularly spaced in time.

System Clock 217 is a logic network which generates a plurality of pulses in a particular sequence which are used for control signals within the present invention.

The above combination of functional elements shown in FIG. 2A operate together to perform the function of a digital phase-locked loop in the following manner.

Initially the digital phase-locked loop must sample the frequency of the Input Signal 101 to determine the average frequency thereof. This is accomplished as follows.

Upon application of Reset Signal 219 to Initialization Counter 207, Initialization Counter 207 begins counting pulses on line 243 generated by Clock 218 immediately following the first Input Event present on line 248 which occurs on Input Signal 101. Initialization Counter 207 continues to count said pulses generated by Clock 218 until a total of eight Input Events have occurred on Input Signal 101.

During the initialization period, Switch 211 connects the contents of Initialization Counter 207 to the inputs of Cumulative Count Register 213, and shortly after the occurrence of the ninth Input Event on Input Signal 101, the contents of Initialization Counter 207 are transferred to Cumulative Count Register 213. Immediately thereafter, Switch 211 changes so as to thereafter connect Integer Portion 209A output of Adder 208 to Cumulative Count Register 213 for transfer of the integer output of said Adder 208 to Cumulative Count Register 213 at the appropriate time, as later described herein.

Simultaneously upon the occurrence of the ninth Input Event on Input Signal 101, Counter 215 begins counting pulses generated by Clock 218.

Compare 216 with signal line 224B-1 connected to signal line 224A-1 from Divide-by-Eight 223, compares the contents of Counter 215 with the number present in Cumulative Count Register 213 after said number has been divided by eight by Divide-by-Eight 223. When the number present in Counter 215 is equal to the number present in Cumulative Count Register 213 after division of the contents thereof by eight by Divide-by-Eight 223, Compare 216 will generate an Output Event on Output Signal 102, which will also reset Counter 215 by signal 222.

At this point it should be observed that the number present in Cumulative Count Register 213 was originally obtained from Initialization Counter 207 and represents the number of pulses generated by Clock 218 during the time required for eight Input Events to occur on Input Signal 101. Consequently, division of the number present in Cumulative Count Register 213 by eight will yield a number which represents the number of pulses from clock 218 expected to occur between successive Input Events on Input Signal 101.

It should also be observed that since Counter 215 is reset by the occurrence of an Output Event on signal line 222 by Output Signal 102, Counter 215 begins counting pulses generated by Clock 218 immediately following the occurrence of said Output Event on Output Signal 102.

With the functional blocks of the Cumulative Count Register 213, Divide-by-Eight 223, Counter 215 and Compare 216 operating as above described, it will be observed that the Output Event on Output Signal 102 will occur when the number of pulses generated by Clock 218 as counted by Counter 215 equals the expected number of pulses generated by Clock 218 between successive Input Events as represented by the integer number stored in Cumulative Count Register 213, after division thereof by eight by Divide-by-Eight 223, and presented to Compare 216 on signal line 224A-1 as connected to signal line 224B-1.

The number which was previously stored in Cumulative Count Register 213, which represents the number of pulses generated by Clock 218 during the interval of time required for eight Input Events to occur on Input Signal 101 is divided by sixteen by Divide-by-Sixteen 214 and supplied as the subtrahend input 201 to Subtractor 246. The Minuend Input 202 to Subtractor 246 is supplied from Counter 215.

Subtractor 246 subtracts a subtrahend 201, which is the current contents of Cumulative Count Register 213 after said contents have been divided by sixteen by Divide-by-Sixteen 214, from a minuend 202 which is the contents of Counter 215. The results of said subtraction will be transferred to Holding Register 221 at the occurrence of an Input Event on Input Signal 101.

Hence division of the contents of Cumulative Count Register 213 by sixteen will yield a number which represents the expected number of pulses generated by Clock 218 to have occurred when the next Input Event is expected to occur on Input Signal 101, from the occurrence of the last Output Event on Output Signal 102. However, Counter 215 is counting the number of pulses generated by Clock 218 which have occurred from the occurrence of the last Output Event on Output Signal 102. On the occurrence of the next Input Event on Input Signal 101, the difference between the number contained in the Cumulative Count Register 213, after division by sixteen by Divide-by Sixteen 214, and the number present in Counter 215 will indicate whether or not the said Input Event on Input Signal 101 occurred when expected. In particular, if said Input Event did not occur when expected, the results of said subtraction will produce a non-zero result 203 which represents the number of pulses generated by Clock 218 by which said Input Event was displaced in time from the point at which it was expected. This number will be referred to herein as Error Signal 203, and will, upon the occurrence of said Input Event on Input Signal 101, be transferred to Holding Register 221.

The Error Signal 203 from Holding Register 221 is applied by signal line 247 to Error Weighting 204.

In dealing with error correction in phase-locked loops, it is generally not desirable to completely correct a phase error in an output signal. Rather, the preferred approach in practice is to correct a phase error in an output signal by only a portion of the measured phase error during each cycle of the output signal, so as to effect a relatively gradual change in the phase of said output signal. By so doing, the phase of the output signal is gradually adjusted to agree with the phase of the input signal.

In the digital phase-locked loop, it will be recalled that the Output Signal 102 is generated by Compare 216 when the number of pulses generated by Clock 218, as counted by Counter 215, equals the expected number of said pulses to occur, as obtained by comparing the contents of Counter 215 with the contents of Cumulative Count Register 213 after said contents thereof have been divided by eight by Divide-by-Eight 223. Consequently, it will be observed that by changing the contents of Cumulative Count Register 213, the point in time at which Compare 216 will generate an Output Event on Output Signal 102 can be altered. It is in this manner that the phase of Output Signal 102 is adjusted to agree with the phase of the Input Signal 101. This relationship can be expressed as $$Cn = Co + EK \qquad (1)$$

where
- $Cn$ = expected number of pulses generated by Clock 218 to occur between successive Input Events on Input Signal 101, after correction for any measured change in phase on Input Signal 101.
- $Co$ = expected number of pulses generated by Clock 218 to occur between successive Input Events on Input Signal 101.
- $E$ = the number of pulses generated by Clock 218 by which the Input Event on Input Signal 101 was displaced in time from the point at which said Input Event was expected.
- $K$ = the amount of correction, expressed as a percent, by which it is desired to adjust the phase of the Output Signal 102 in response to a change in phase on Input Signal 101.

It is observed from equation (1) that the value chosen for K will control the amount of time required by the present invention to respond to a change in the phase occurring on Input Signal 101. It will be particularly noted that the value assigned to K could be dynamically changed, based, for example, upon the measured error, or other factors dictated by the particular application. Such extensions or modifications of the present invention are contemplated by the present invention.

In the present embodiment, however, a static value for K has been chosen equal to 6.25%, based upon the fact that binary division by 16 is easily implemented, i.e., 1/16=0.0625.

Replacing K with 1/16 in equation (1) yields $$Cn = Co + E/16 \qquad (2)$$

Multiplying each side of equation (2) by eight yields $$8Cn = 8(Co + E/16) \qquad (3)$$

$$8Cn = 8Co + E/2 \qquad (4)$$

It is observed that 8Co represents the number present in Cumulative Count Register 213. It follows from equation 4 that by dividing the measured error by two, and adding the resulting quotient to the current contents of Cumulative Count Register 213, the resulting sum will equal eight times the expected number of pulses to be generated by Clock 218 which are anticipated to occur between successive Input Events on Input Signal 101, to correct the phase of the Output Signal 102 by 6.25% of the measured error signal 203.

Consequently Error Weighting Factor 204 in the present embodiment provides for division by two of error signal 203.

Adder 208, as indicated by equation (4), performs the addition of the measured error 203 after division by two, with the contents of Cumulative Count Register 213.

Thereafter, the number present in Cumulative Count Register 213 represents the number of pulses generated by Clock 218 expected to occur between successive Input Events on Input Signal 101, to affect a phase adjustment of 6.25% of a measured error in phase occurring on the Input Signal 101, multiplied by eight.

While the above description of the operation of the digital phase-locked loop has been in general terms, practical considerations raised by implementing the digital phase-locked loop with hardware must be taken into consideration in the reduction to practice.

Due to the fact that Error Weighting 204 requires division of Error Signal 203 by two, clearly a numeric result is possible which may be composed of a whole number and a fractional part. Therefore, the number present in Cumulative Count Register 213 may be composed of a whole number plus a fractional part. Consequently, when the contents of Cumulative Count Register 213 are divided by eight by Divide-by-Eight 223 and presented to Compare 216 by signal line 224A-1 connected to signal line 224B-1, any fractional part present on signal line 225-1 is not considered by Compare 216 in comparing the contents of Cumulative Count Register 213 after division by eight by Divide-by-Eight 223, with the contents of Counter 215. Likewise, during initialization, as only whole number pulses generated by Clock 218 are counted by Initialization Counter 207, necessarily only a whole number result is transferred by Switch 211 to Cumulative Count Register 213. Consequently Switch 211 switches only the whole number inputs to Cumulative Count Register 213 between Initialization Counter 207 and Adder 208. The fractional results from Adder 208 are therefore connected directly to the appropriate fractional portion of Cumulative Count Register 213 as discussed more fully hereafter.

The implementation of the functional blocks of FIG. 2A will now be discussed.

The embodiment of the digital phase-locked loop was implemented using the following standard parts available from Texas Instruments Incorporated, P.O. Box 5012, Dallas, Tex. 75222.

| Part Type | Description |
|---|---|
| 74S00 | Quad 2-Input NAND |
| 74S04 | Hex Inverter |
| 74S08 | Quad 2-Input AND |
| 74S74 | Dual-D Flip Flop |
| 74S85 | 4-Bit Magnitude Comparator |
| 74S86 | Quadruple 2-Input Exclusive-OR Gate |
| 74S157 | 4-Bit 2-to-1 Select |
| 74S161 | 4-Bit Binary Counter |
| 74S175 | 4-Bit D-Register |
| 74S283 | 4-Bit Adder |

The reference data sheets on each of the above listed parts, as same appears in *The TTL Data Book*, Second Edition-1976, Texas Instruments Incorporated, is incorporated herein by reference.

Clock 218 can be implemented in numerous ways well known in the art. In the preferred embodiment of the digital phase-locked loop, the frequency at which Clock 218 was chosen to operate was approximately twenty times the expected frequency of Input Signal 101.

Figure 5A:
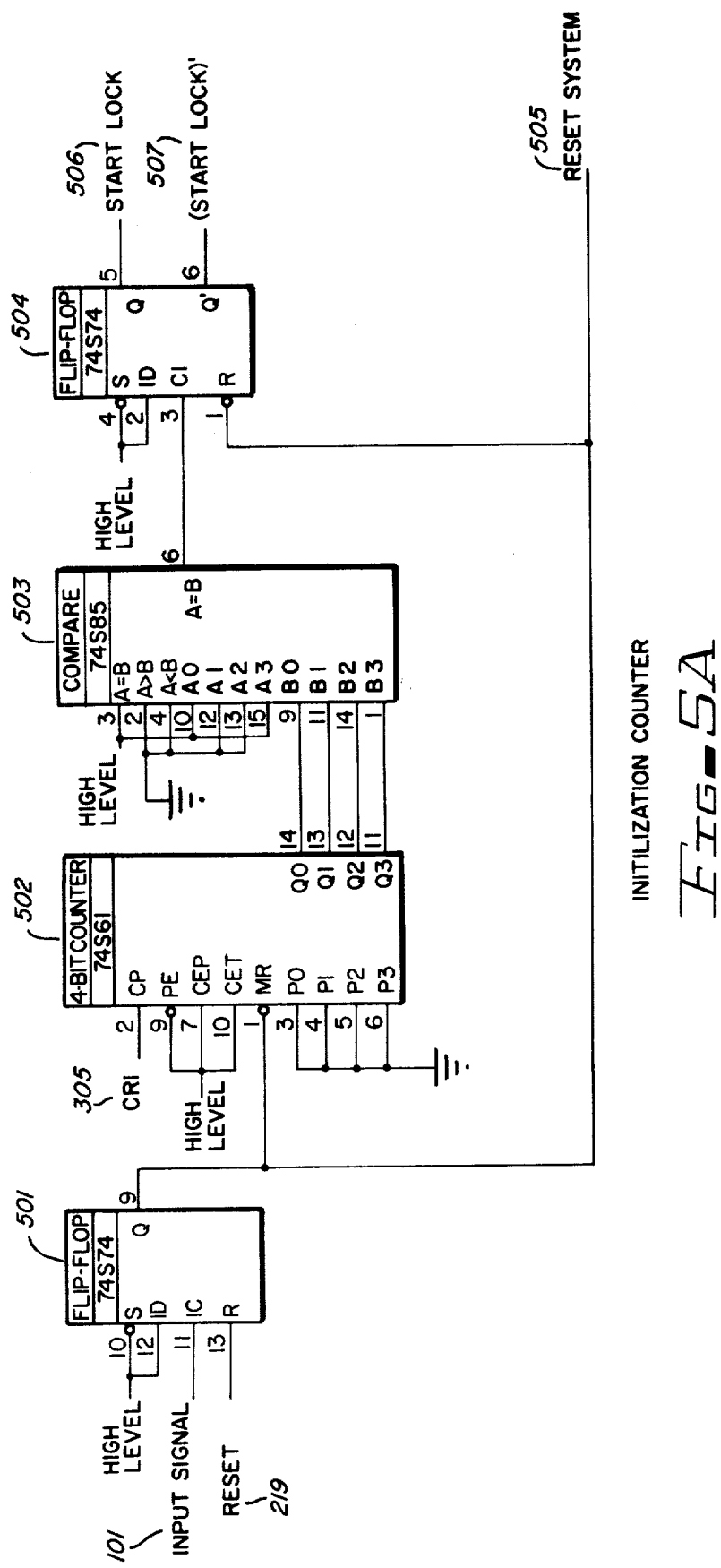
FIGS. 5A and 5B illustrate the implementation of Initialization Counter 207 shown in FIG. 2A.
Figure 5B:
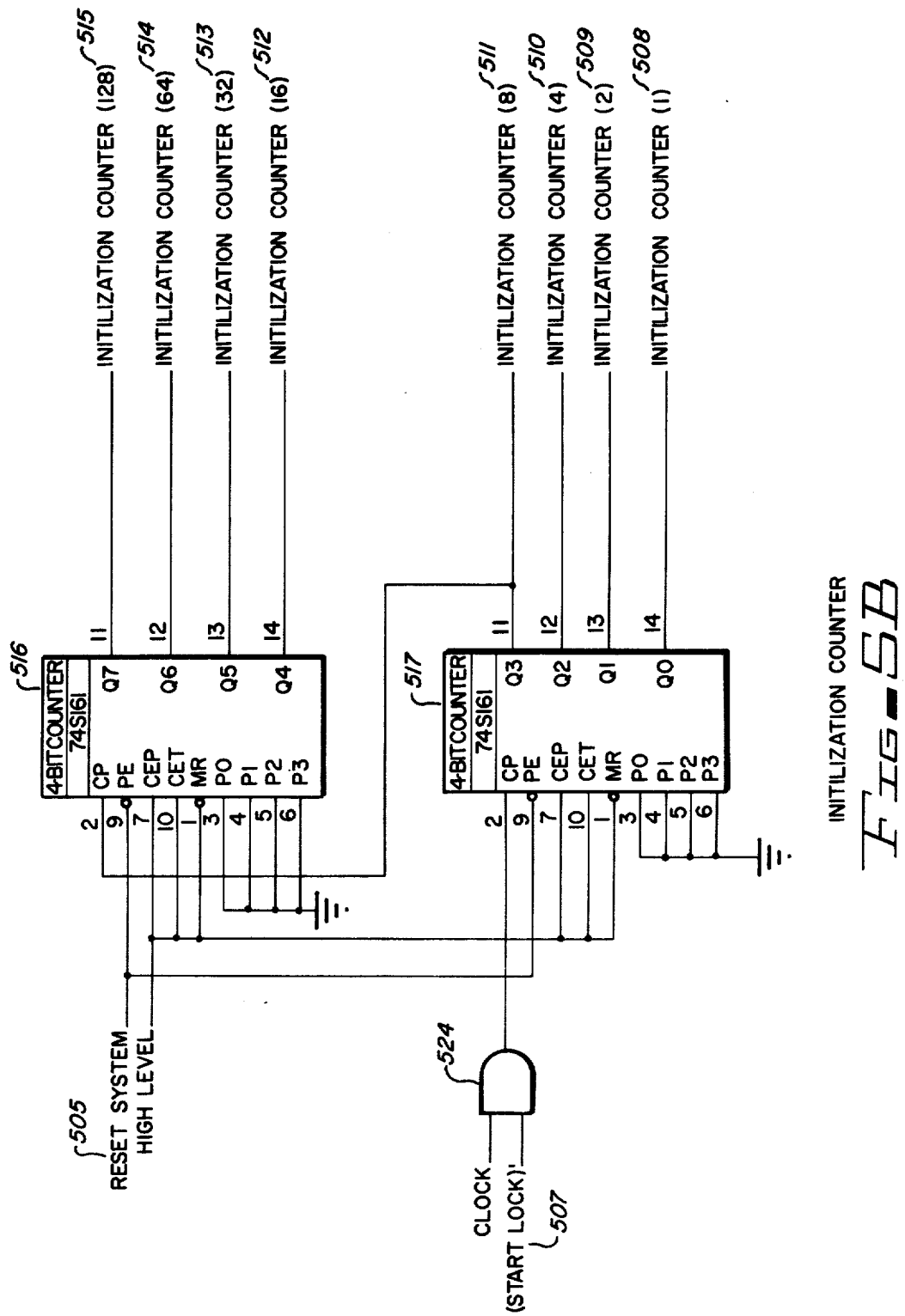

FIGS. 5A and 5B show the implementation of Initialization Counter 207. From FIG. 5A it will be observed that when Reset 219 goes low, Flip-Flop 501 is placed in the reset state, which results in its "Q" output, Reset-System 505, going low, which in turn clears 4-Bit Counter 502 and Flip-Flop 504 shown in FIG. 5A, Quad-D Flip-Flop 301 shown in FIG. 3, 4-Bit Counters 516 and 517 shown in FIG. 5B, Flip-Flop 902 shown in FIG. 9, 4-Bit Shift Registers 1110 and 1111 shown in FIG. 11, 4-Bit Registers 1203, 1204 and 1205 shown in FIG. 12, and gate 1306 shown in FIG. 13.

Figure 4:
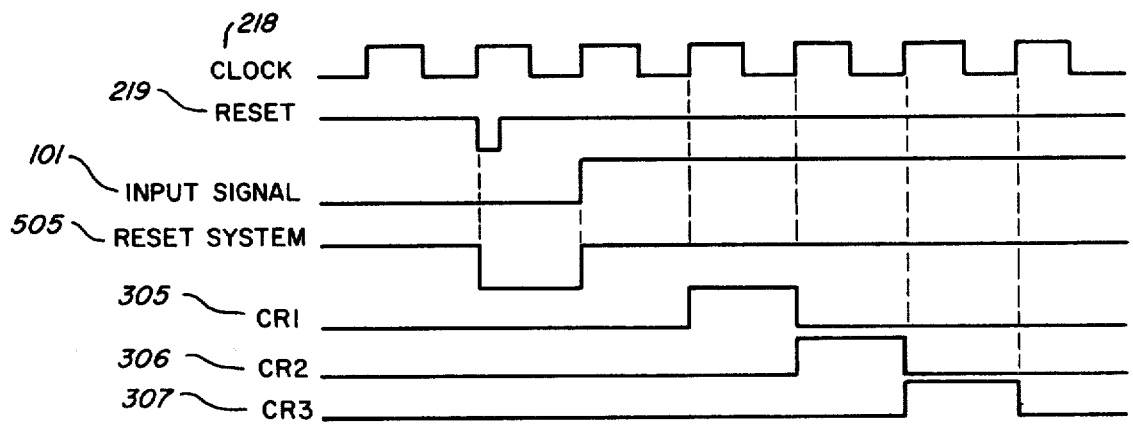
FIG. 4 illustrates the timing relationships of various signals in the digital phase-locked loop.

Referring next to FIG. 3, the implementation of System Clock 217 is shown. It is observed that Quad-D Flip-Flop 301 and Exclusive-OR Gates 302, 303 and 304 are connected in such a manner as to generate sequential control signals CR1 305, CR2 306, and CR3 307 in response to Reset 219, Reset System 505, Input Signal 101 and Clock 218 as shown in FIG. 4, as follows. With Flip-Flop 301 initially reset by Reset-System 505, outputs Q1, Q2, Q3 and Q4 are all at logic zero. When Input Signal 101 changes to a high state, sequential control signals CR1 305, CR2 305, and CR3 307 will be subsequently generated upon the occurrence of sequential pulses on Clock 218. Control signals CR1 305, CR2 306, and CR3 307 are used for sequencing purposes within the present invention.

Returning now to FIGS. 5A and 5B, the operation of Initialization Counter 207 will now be discussed. Four-Bit Counter 502, Compare 503 and Flip-Flop 504 shown in FIG. 5A function together to count the occurrence of eight Input Events on Input Signal 101, during which time 4-Bit Counters 516 and 517 shown in FIG. 5B count the number of pulses generated by Clock 218 to determine the number of pulses generated by Clock 218 during the time required for eight Input Events to occur on Input Signal 101, as follows.

With Flip-Flop 504, shown in FIG. 5A, previously reset by Reset-System 505, (Start-Lock)' will be high, which, by gate 524 in FIG. 5B, will allow 4-Bit Counters 516 and 517 to count the number of pulses generated by Clock 218.

Referring next to FIG. 5A, 4-Bit Counter 502 counts the occurrences of CR1 305, and Compare 503 compares the count obtained by 4-Bit Counter 502 with the number nine as wired into pins A0, A1, A2 and A3 on said Compare 503. After the occurrence of eight Input Events on Input Signal 101, as indicated by the occurrence of a CR1 305 pulse for each of the Input Events on Input Signal 101, on the following Input Event, Compare 503 output A=B will change to a logic one which will result in Flip-Flop 504 "Q" output going high. Hence Start-Lock will change to a high state. This indicates completion of the initialization period during which time the digital phase-locked loop was sampling the frequency of the Input Signal 101 by counting the number of pulses generated by Clock 218 by 4-Bit Counters 516 and 517 shown in FIG. 5B during the time period required for eight Input Events as counted by 4-Bit Counter 502 shown in FIG. 5A to occur on Input Signal 101.

Next, the number of pulses generated by Clock 218 counted by 4-Bit Counters 516 and 517 shown in FIG. 5B, of Initialization Counter 207 will be transferred to the Cumulative Count Register 213 by way of Switch 211, as shown in FIG. 2A as follows.

Figure 8:
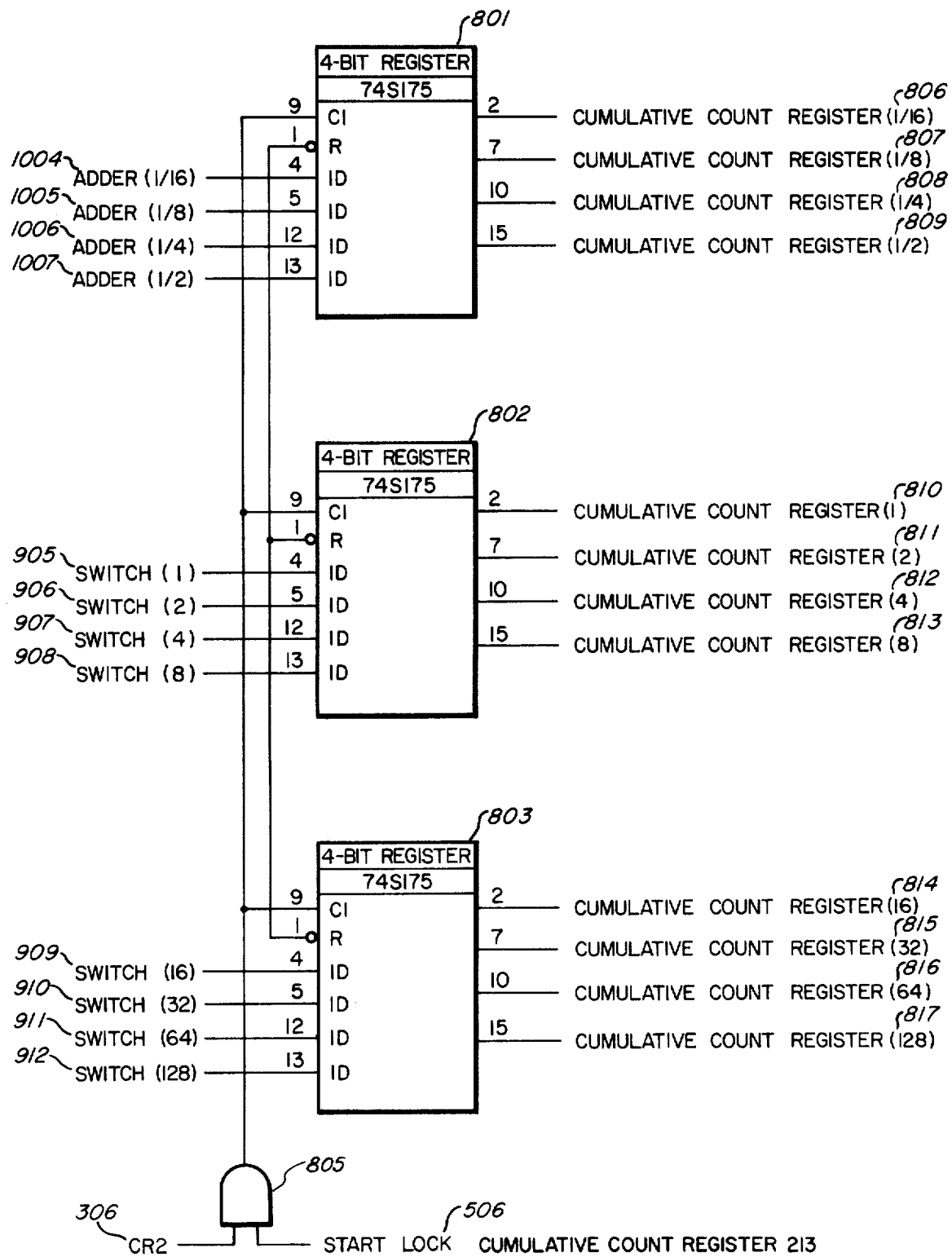
FIG. 8 illustrates the implementation of Cumulative Count Register 213 shown in FIG. 2A.
Figure 9:
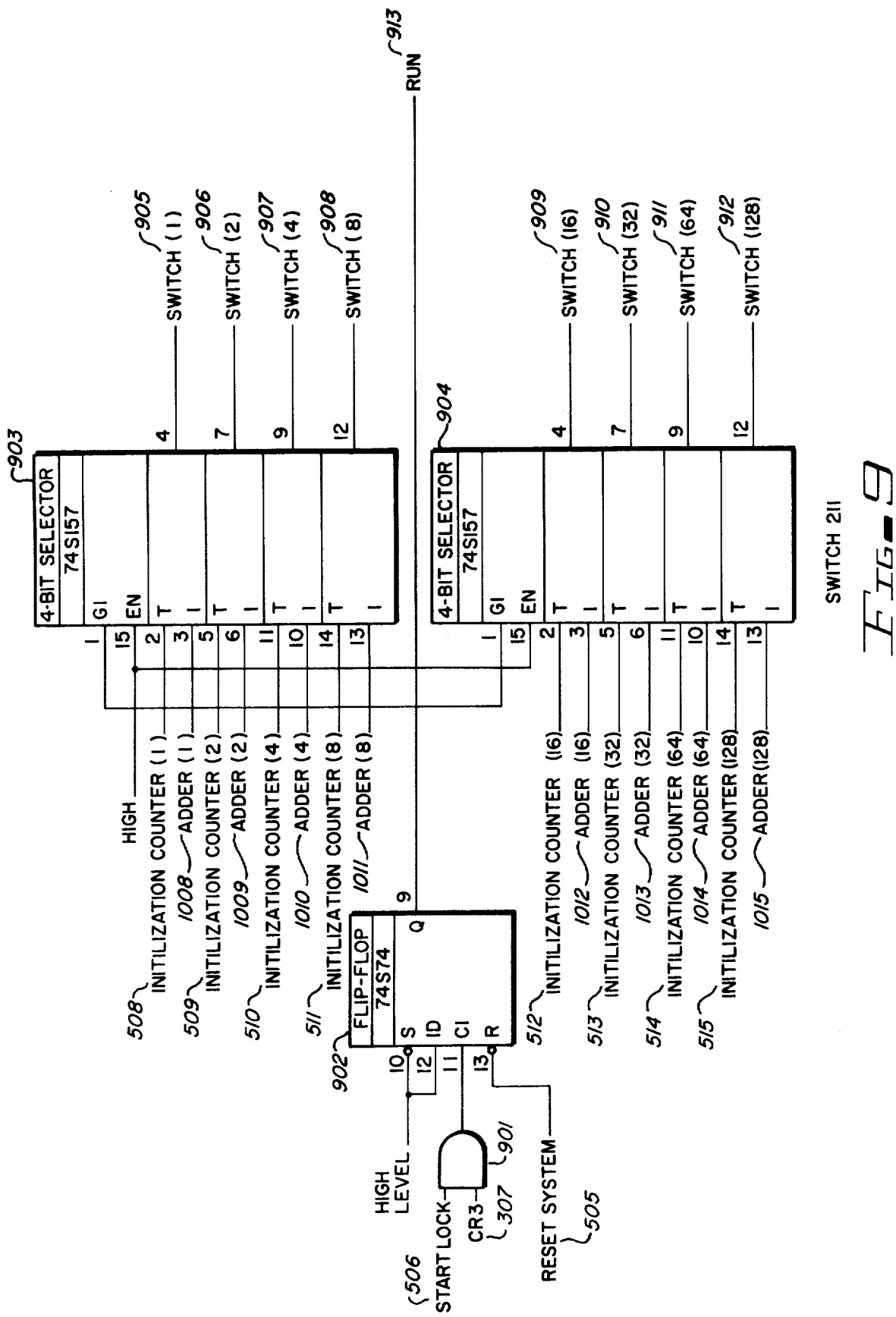
FIG. 9 illustrates the implementation of Switch 211 shown in FIG. 2A.

Referring to FIG. 9, with Flip-Flop 902 previously reset by Reset-System 505, the "Q" output of said flip-flop is low, which places 4-Bit Selectors 903 and 904 in a state wherein the outputs of Initialization Counter (1) 508 through Initialization Counter (128) 515 shown in FIG. 5B are connected through said Switch 211 as implemented by 4-Bit Selectors 903 and 904 on FIG. 9 to the corresponding outputs of said Selectors 903 and 904 to Switch (1) 905 through Switch (128) 912 which, referring to FIG. 8, thereby effectively connecting said outputs of Initialization Counter (1) 508 through Initialization Counter (128) 515 to the corresponding inputs of 4-Bit Registers 802 and 803 of Cumulative Count Register 213. Consequently, referring to FIG. 8, gate 805, since Start-Lock is high, on the occurrence of CR2 306 generated by the ninth Input Event on Input Signal 101, the contents of 4-Bit Counters 516 and 517 of FIG. 5B of Initialization Counter 207 of FIG. 2A will be transferred to 4-Bit Registers 802 and 803 of FIG. 8 of Cumulative Count Register 213 of FIG. 2A.

At this point, the present invention has started operation from a reset condition, and has completed the portion of the initialization process wherein the frequency of Input Signal 101 has been effectively sampled by the counting of the number of pulses generated by Clock 218 during the time required for eight Input Events to occur on Input Signal 101.

The remaining task to be completed in the initialization process is to preload Counter 215 shown in FIG. 2A with the number ten.

Figure 6:
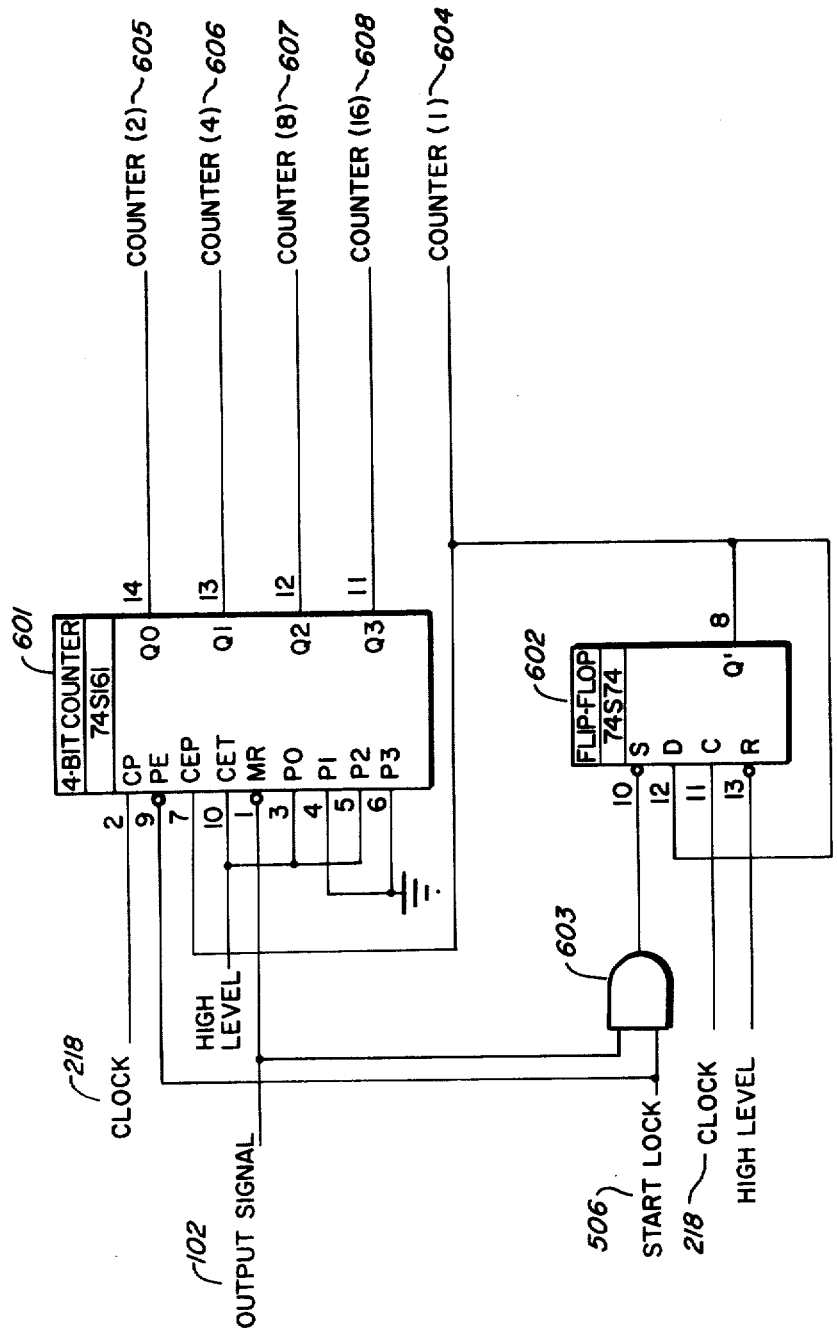
FIG. 6 illustrates the implementation of Counter 215 shown in FIG. 2A.

The implementation of Counter 215 is given in FIG. 6. Four-Bit Counter 601 and Flip-Flop 602 together form Five-Bit Counter 215.

It is recalled that during the initialization period discussed above, Start-Lock signal 506, shown in FIG. 5A is low and changes to a high state at the completion of said initialization period. Consequently, referring to FIG. 6, during the initialization period, Flip-Flop 602 will remain in the reset state due to the output of gate 603 being low. It will also be observed that the upper 4 bits of Counter 215 as implemented by 4-Bit Counter 601 will be preset by the high level present on preset input pins 3 and 5 and the low level present on pins 4 and 6 such that Counter 215 will be preset to a value of ten during the initialization period. Such presetting is required because, referring to FIG. 1A, it is recalled that the Output Signal 102 occurs at a point midway between successive Input Events on Input Signal 101, and as Counter 215 is, during operation normally reset on the occurrence of Output Signal 102, it will normally begin counting pulses generated by Clock 218 immediately after the occurrence of an Output Event on Output Signal 102. However, when the digital phase-locked loop is initially commencing operation after the occurrence of a Reset Signal 219, Counter 215 will necessarily be counting pulses generated by Clock 218 after the occurrence of an Input Event on Input Signal 101. Consequently, it is necessary to preset Counter 215 with a number to reflect the difference in starting times for Counter 215. With the frequency for Clock 218 chosen to be twenty times the expected frequency of Input Signal 101, Counter 215 must therefore be preset with the number ten.

Consequently, directly following the initialization of the digital phase-locked loop by the counting of pulses generated by Clock 218 by Initialization Counter 207, and the transfer of said count to Cumulative Count Register 213, Start-Lock 506 will go to a high state, enabling Counter 215, as implemented by 4-Bit Counter 601 and Flip-Flop 602 on FIG. 6 to begin counting pulses generated by Clock 218, from an initial value of ten.

Figure 11:
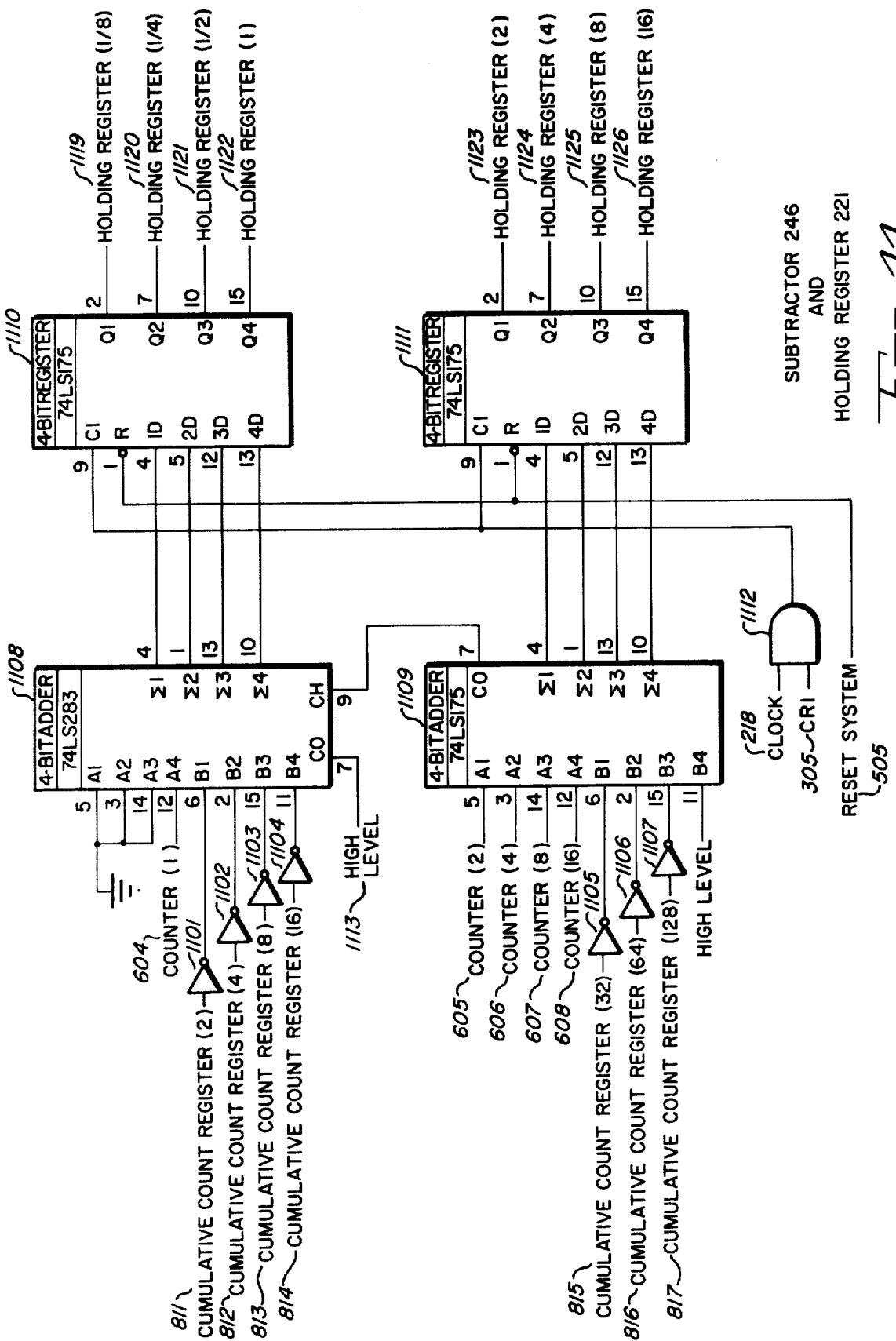
FIG. 11 illustrates the implementation of Subtractor 246 and Holding Register 221 shown in FIG. 2A.

FIG. 11 illustrates the implementation of Divide-by-Sixteen 214, Subtractor 246 and Holding Register 221 shown in FIG. 2A.

Subtractor 246 is implemented by 4-Bit Adders 1108 and 1109, and Inverters 1101 through 1107. The subtraction is implemented by first forming the 2's complement of the subtrahend, i.e., the number present in Cumulative Count Register 213 on FIG. 2A, by Inverters 1101 through 1107 and the addition of a one to the carry input 1113 of 4-Bit Adder 1108, and thereafter adding the minuend, the number present 202 in Counter 215 on FIG. 2A, i.e., Counter (1) 604 through Counter (16) 608 shown in FIG. 6.

Divide-by-Sixteen 214 is implemented by the manner in which the signals representing the minuend and subtrahend are connected to 4-Bit Adders 1108 and 1109. It is observed that the most significant bit of the 2's complement of the number present in Cumulative Count Register 213 is added to the most significant bit of the number present in Counter 215, i.e., Counter (16) 608, which results in the equivalence of dividing the number present in Cumulative Count Register 213 by sixteen prior to subtraction.

Holding Register 221 shown in FIG. 2A is implemented by 4-Bit Registers 1110 and 1111 shown in FIG. 11, to which the results of Subtractor 246 is transferred upon the occurrence of a Clock 218 and CR1 305 to gate 1112.

As previously described, Error Weighting 204 shown in FIG. 2A functions to divide the number present in Holding Register 221 by two. As the results of this division by two are added to the current contents of Cumulative Count Register 213 by Adder 208, said division by two can be implemented by the method by which the signals representing the contents of Holding Register 221 are connected to Adder 208.

Figure 10:
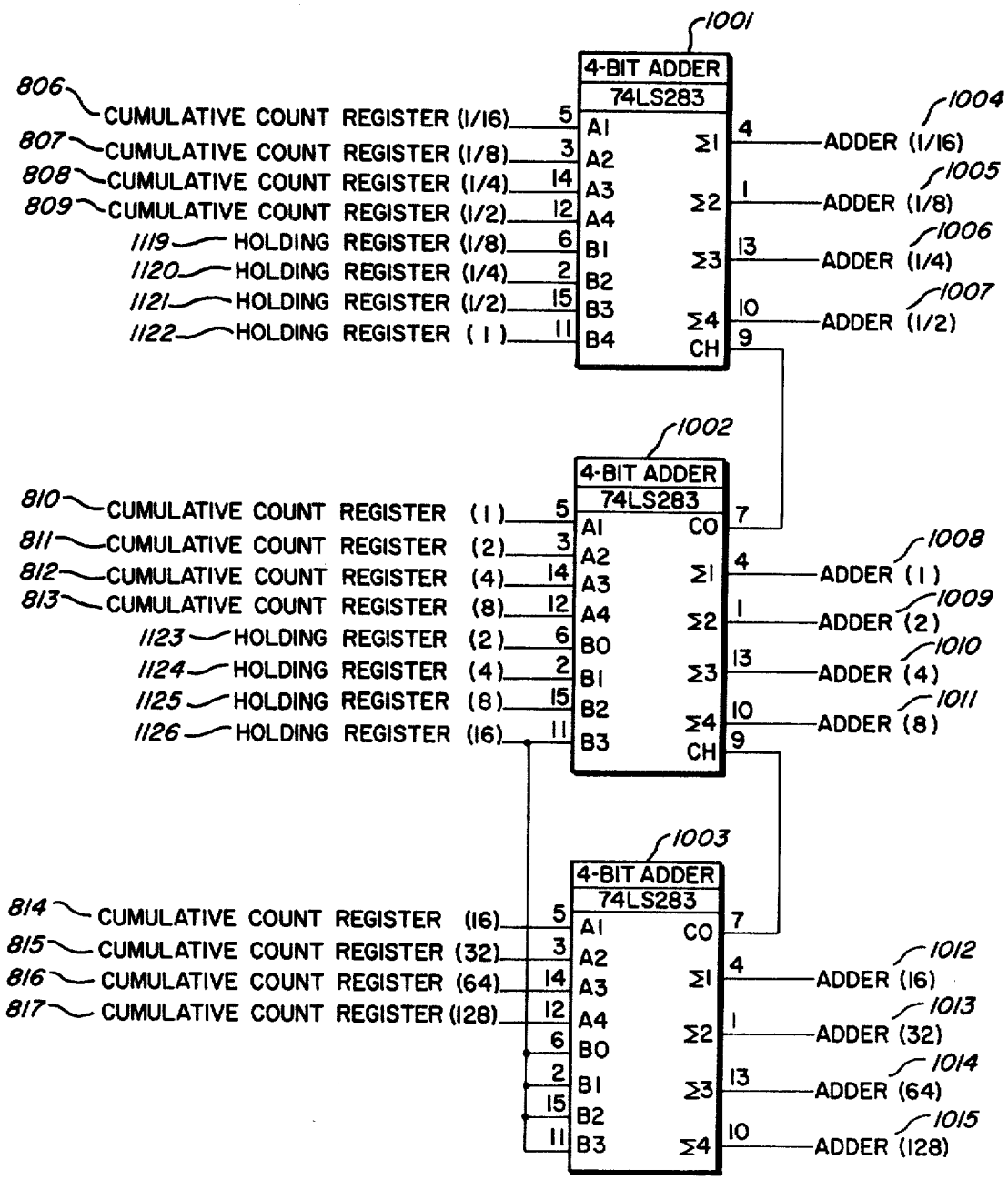
FIG. 10 illustrates the implementation of Adder 208 and Error Weighting 204 shown in FIG. 2A.

The implementation of Error Weighting 204 and Adder 208 is shown in FIG. 10. Four-Bit Adders 1001, 1002, and 1003 implement Adder 208 shown in FIG. 2A. It is observed that the signal representing the number present in Holding Register 221 have been shifted one binary position so as to implement division-by-two as above discussed, with Holding Register ($\frac{1}{2}$) 1119 through Holding Register (16) 1126 being connected in such a manner that the signals thereon appear in the outputs of 4-Bit Adder 1001 and 1002 as Adder (1/16) 1004 through Adder (8) 1011 respectively. The most significant bit of the results of the subtraction by Subtractor 246 shown in FIG. 2A, with implementation thereof shown in FIG. 11, is connected to the upper four bits of the implementation of Adder 208 shown in FIG. 2A with implementation shown in FIG. 10, so as to correctly reflect the sign as well as the status of the remaining upper bits on error signal 205 after approximate weighting by Error Weighting 204 shown in FIG. 2A, in the addition performed by 4-Bit Adders 1001 through 1003 shown in FIG. 10, by Holding Register (16) 1126 signal being also connected to 4-Bit Adder 1003 pins 6, 2, 15 and 11.

The contents of Adder 208 shown in FIG. 2A are then connected to Cumulative Count Register 213. This is illustrated in FIGS. 10, 9 and 8. It is observed that the lower order four bits from Adder 208, i.e., Adder (1/16) 1004 through Adder ($\frac{1}{2}$) 1007, do not go through Switch 211, but connect directly to the lower order 4 bits of Cumulative Count Register 213, shown in FIG. 2A as Fractional Portion 209B, i.e., Adder (1/16) 1004 through Adder ($\frac{1}{2}$) 1007 to 4-Bit Register 801 shown in FIG. 8. This results from the fact that the said four lower bits from Adder 208 represent a fractional number, and as Initialization Counter 207 counts in whole numbers only, it is not necessary to be able to switch the lower four order bits from Initialization Counter 207 to Cumulative Count Register 213. The remaining bits of Adder 208, Adder (1) 1008 through Adder (128) 1015 shown in FIG. 10 connect through Switch 211 shown in FIG. 2A as implemented in 4-Bit Selectors 903 and 904 shown in FIG. 9, and then to Cumulative Count Register 213 as implemented by 4-Bit Register 802 and 803 shown in FIG. 8.

Figure 7:
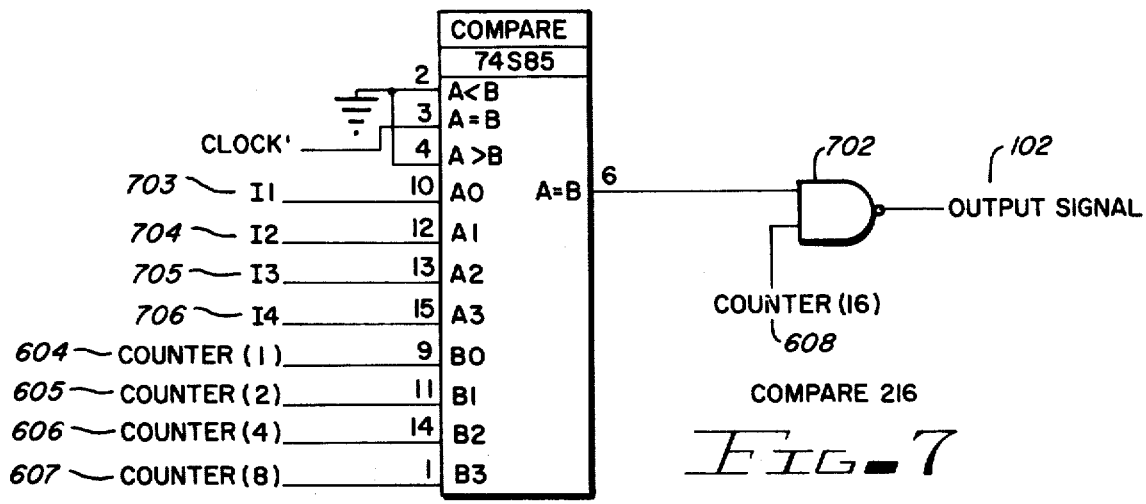
FIG. 7 illustrates the implementation of Compare 216 shown in FIG. 2A.

The implementation of Divide-by-Eight 223 and Compare 216 shown in FIG. 2A is illustrated in FIG. 7. Compare 701 and NAND gate 702 together perform the said functions in the following manner.

Integer Part 224A-1 from Divide-by-Eight 223 is connected to 224B-1 input to Compare 216 shown in FIG. 2A with the signals of Cumulative Count Register (8) 813, Cumulative Count Register (16) 814, Cumulative Count Register (32) 815 and Cumulative Count Register (64) 816 connected to input signals I1 703, I2 704, I3 705 and I4 706 respectively. The division function of Divide-by-Eight 223 is once again implemented by the manner in which the signals from Cumulative Count Register 213, i.e., Cumulative Count Register (64) through Cumulative Count Register (8) and the signals from Counter 215, i.e., Counter (1) 604 through Counter (16) 608 are connected to Compare 701. Referring to FIG. 7, it is observed the Cumulative Count Register (128) 817 is assumed to be a one, as it necessarily must be when Output Signal 102 is to be produced and consequently, NAND gate 702 ANDS Counter (16) 608 with the signal from Compare 701 indicating agreement between the numbers represented by the signal present on Counter (1) 604 through Counter (8) 607 and the number represented by the signals present on Cumulative Count Register (8) 813 through Cumulative Count Register (64) 816, thereby generating Output Signal 102.

Upon the occurrence of Output Signal 102, Counter 215 shown in FIG. 2A as implemented by 4-Bit Counter 601 and Flip-Flop 602 shown in FIG. 6 is reset. At this point, the process is repeated, with Counter 215 shown in FIG. 2A immediately beginning to again start counting the occurrence of pulses generated by Clock 218.

The basic response of the described digital phase-locked loop is modified by the present invention of a long term response enhancement, by connecting Fractional Part 225-1 and Integer Part 224A-1 shown in FIG. 2A to Fractional Part 225-2 and Integer Part 224A-2 respectively shown in FIG. 2B, and the output 202-1 from Counter 215 shown in FIG. 2A to 202-2 shown in FIG. 2B, thereby incorporating the present invention of a long term response enhancement in the described digital phase-locked loop.

From the foregoing discussion of the operation of the digital phase-locked loop, and by reference to FIG. 2A, it is observed that Output Signal 102 is generated upon the occurrence of agreement between the count in Counter 215 and the integer portion of the number resulting from dividing the contents of Cumulative Count Register 213 by eight by Divide-by-Eight 223. Consequently, the generation of an Output Signal can be delayed by increasing the value of the number against which the contents of Counter 215 must agree. This is the manner by which the present invention introduces a relatively minor change in the phase of Output Signal 102 over a relatively long period of time.

FIG. 2B illustrates, in block diagram form, an implementation of the present invention. From FIG. 2B it will be observed that the integer portion 224A-2 from Divide-by-Eight 223 is supplied as one input to Adder 226. The second input to Adder 226 is a single input of either a numeric one or zero, from Logic 228. The results of the addition 231 performed by Adder 226 are stored in Register 233, with the contents 234 being supplied 224B-2 to 224B-1 to Compare 216 shown on FIG. 2A.

The various blocks illustrated in FIG. 2B function as follows.

Adder 226 functions to add the integer number present on 224A-2 to either a one or a zero present on line 229 from Logic 228, and transfer the results 231 of said addition to Register 233 upon the occurrence of a transfer signal on line 245.

Adder 227 functions to add the integer number present on 224A-2 with either a one or a zero present on line 230 from Logic 228, and thereafter supply the results 232 to Compare 236, Compare 239 and Compare 240.

Register 233 functions to store the results 231 from Adder 226, making said results 234 available to Compare 236 and, by signal line 224B-2 to Compare 216 on FIG. 2A. Upon the occurrence of a pulse on line 245, the contents of Register 233 are transferred to Register 235.

Register 235 functions to store the number previously stored in Register 233, making said number available to Compare 239. Upon the occurrence of a pulse on line 245, the contents of Register 235 are transferred to Register 238.

Register 238 functions to store the number previously stored in Register 235, making said number available to Compare 240.

Compare 236 compares the number on signal line 234 present in Register 233 with the results present on line 232 from Adder 227, and indicates equality, or lack thereof 243 to Logic 228.

Compare 239 compares the number on signal line 237 present in Register 235 with the results present on line 232 from Adder 227, and indicates equality or lack thereof 242 to Logic 228.

Compare 240 compares the number on signal line 244 present in Register 238 with the results present on line 232 from Adder 227, and indicates equality or lack thereof 241 to Logic 228.

Logic 228, responsive to Fractional Part 225-2 from Divide-by-Eight 223 shown in FIG. 2A, the conntents 202-2 of Counter 215, signal 243 from Compare 236, signal 242 from Compare 239, and signal 241 from Compare 240 generates a binary one or a binary zero on line 229 and a binary one or a binary zero on line 230 to Adder 226 and Adder 227 respectively. Logic 228 also, in response to control signals from System Clock 217 generates a pulse on line 245 to effect the transfer of the results of Adder 226 to Register 233, the contents of Register 233 to Register 235, and the contents of Register 235 to Register 238.

The implementation of the functional blocks of FIG. 2B will now be discussed.

The preferred embodiment of the present invention was implemented using the standard parts available from the said Texas Instruments previously given, in addition to the following:

| Part Type | Description |
|---|---|
| 74S08 | QUAD 2-INPUT OR Gate |

Figure 13:
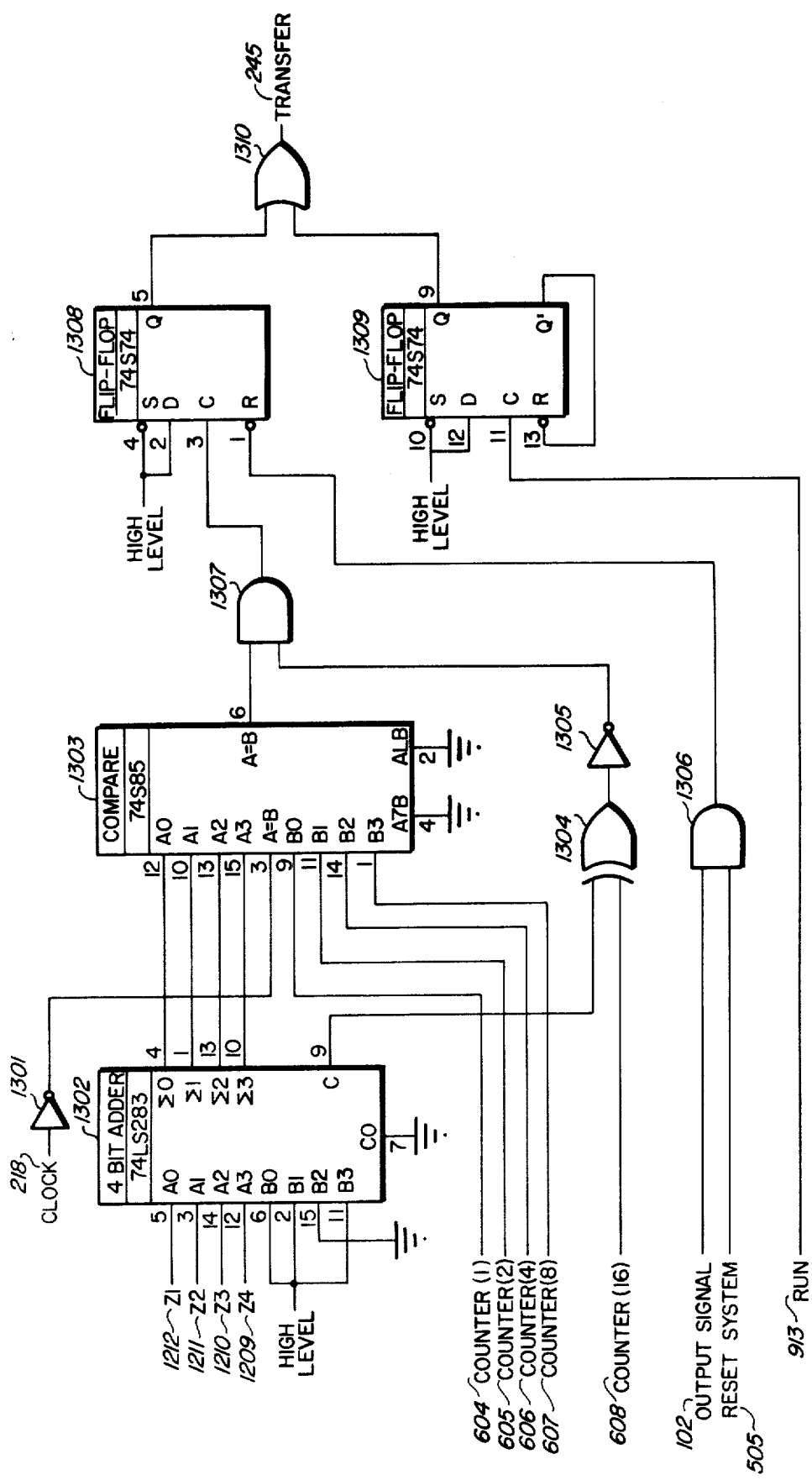
FIG. 13 illustrates the implementation of that portion of Control Logic 228 which generates the signal to transfer the contents of Adder 226 to Register 233, the contents of Register 233 to Register 235 and the contents of Register 235 to Register 238, shown in FIG. 2B, as signal 245.

FIG. 13 shows the implementation of that part of Logic 228 which generates signal 245 which results in the transfer of the results of Adder 226 to Register 233, the contents of Register 233 to Register 235, and the contents of Register 235 to Register 238.

As previously discussed the present invention results in a modification of the number presented to Compare 216. The point in time of the operation of the digital subtractor at which the calculation takes place of the new number to be supplied to Compare 216 has been chosen to be three periods of Clock 218 before the number present on Integer Part 224A-1 and the number present in Counter 215 would otherwise agree. This point is obtained by subtracting three from the last value used for comparison purposes from Cumulative Count Register 213 after division thereof by eight-by-Division-by-Eight 223, and subsequent modification by Adder 226, as stored in Register 233. Consequently, from the contents of Register 233, as implemented by 4-Bit Register 1203 shown in FIG. 12, a negative three is subtracted by 4-Bit Adder 1302 in FIG. 13, with the results of said subtraction being compared with the contents of Counter 215 by Compare 1303 and Exclusive-OR gate 1304 in FIG. 13. It is observed that the said comparison function is implemented using Compare 1303 for the lower order four bits, and Exclusive-OR gate 1304 and Inverter 1305 for the higher order bit. Agreement between the said two numbers is indicated by a high from AND gate 1307, which results in Flip-Flop 1308 being set. Consequently, a transition occurs from OR gate 1310 on Transfer signal 245 which, referring to FIG. 12, results in the transfer of contents of said registers as previously discussed.

At this point it is also observed that Flip-Flop 1308 was previously reset from the last Output Signal generated by the digital phase-locked loop from AND gate 1306.

Figure 12:
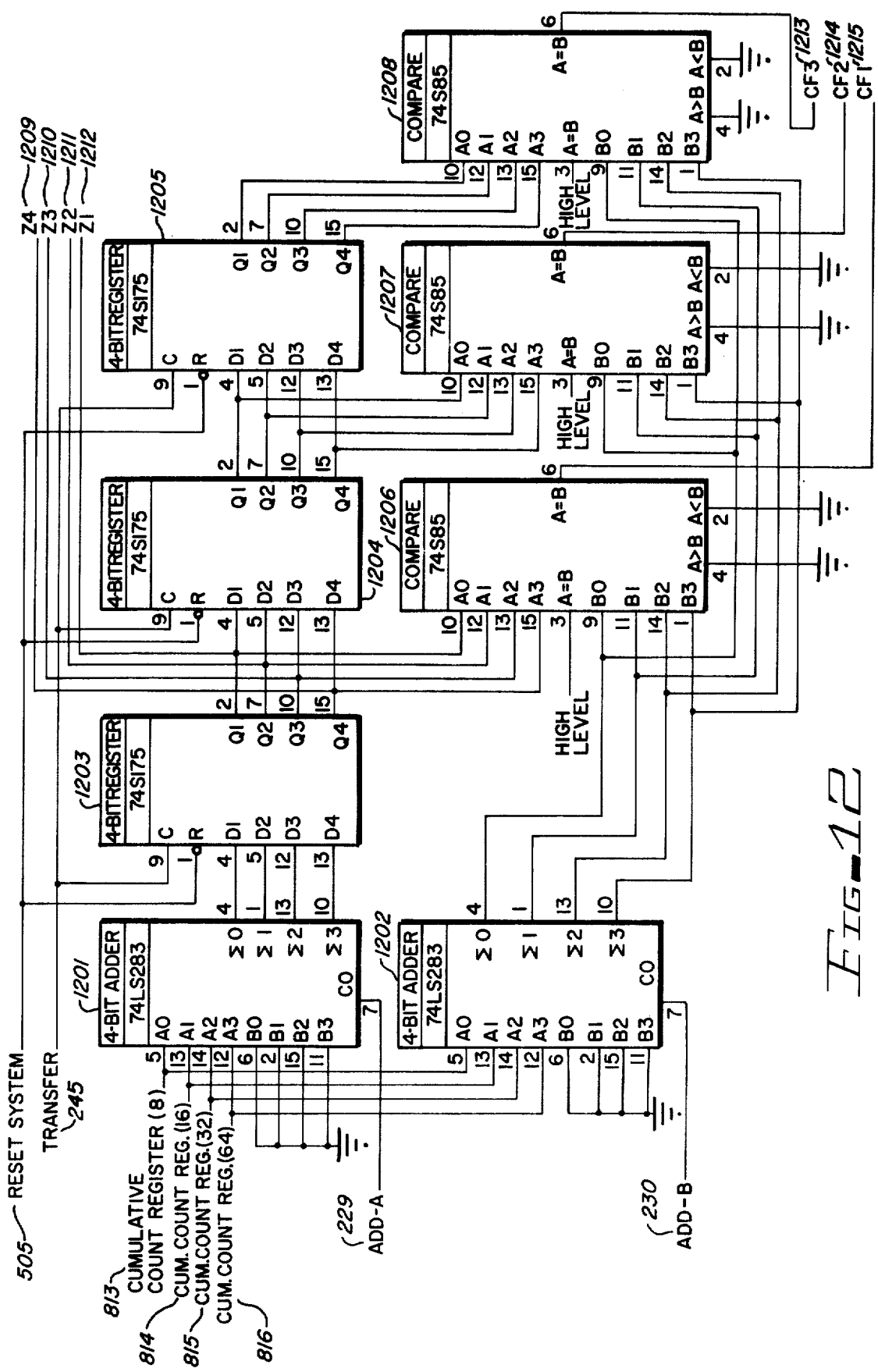
FIG. 12 illustrates the implementation of ADDERs 226 and 227, REGISTERs 233, 235 and 238, and COMPARE 236, 239, and 240 shown in FIG. 2B.

Flip-Flop 1309 shown in FIG. 13, being set in response to RUN 913 from FIG. 9 effects the transfer of an initial value into Register 233 shown in FIG. 2B, and implemented as 4-Bit Register 1203 shown on FIG. 12, directly after initialization of the digital phase-locked loop with the completion of the count by Initialization Counter 207.

FIG. 12 illustrates the implementation of Adders 226 and 227, Registers 233, 235 and 238, and Compare 236, 239 and 240 shown in FIG. 2B.

Signals 229 and 230 to ADDER 226 and ADDER 227 respectively, shown in FIG. 2B are generated in accordance with the following Boolean equations.

SIGNAL 230 = DE

SIGNAL 229 = CE'D + ABCD'E + (ABC)'DE where
A = CF3 1213 shown in FIG. 12
B = CF2 1214 shown in FIG. 12
C = CF1 1215 shown in FIG. 12
D = CUMULATIVE COUNT REGISTER (4) 812 shown in FIG. 8
E = CUMULATIVE COUNT REGISTER (2) 811 shown in FIG. 8

We claim:

1. A digital phase-locked loop, having an input terminal adapted to receive an input signal, comprising:
    (a) register means for storing a first digital number, said first digital number having a value corresponding to a sum of an error signal and an initial value stored in said register means;
    (b) counter means for counting clock pulses of a predetermined frequency thereby containing therein a second digital number;
    (c) compare means for comparing a modified first digital number to the second digital number stored in said counter means, to generate an output signal when said modified first digital number equals said second digital number;
    (d) subtractor means for subtracting said first digital number from said second digital number in response to a control signal generated from said input signal, to generate said error signal; and
    (e) means for delaying the application of said first digital number to said compare means, said means for delaying operatively connected to said register means and said compare means, said means for delaying increasing said first digital number thereby generating said modified first digital number, said modified first digital number applied to said compare means resulting in a small change in phase of said output signal over a long period of time.

2. A digital phase-locked loop, according to claim 1, wherein said register means comprises:
    (a) a cummulative count register, operatively connected to said means for delaying; and
    (b) an adder, operatively connected to said subtractor means and said cummulative count register, which performs the addition of said error signal to the contents of the cummulative count register.

3. A digital phase-locked loop, according to claim 2, wherein said subtractor means comprises:
    (a) a digital subtractor means, operatively connected to said register means for receiving said first digital number, and further operatively connected to said counter means for receiving said second digital number, for forming a difference value of said first and second digital numbers; and
    (b) error weighting means for applying a numeric weighting factor to said difference value of said digital subtractor means to generate said error signal.

4. A digital phase-locked loop, according to claim 3 further comprising:
    initialization means for loading said initial value stored in said register means.

* * * * *